United States Patent
Sprietsma et al.

(10) Patent No.: US 6,739,879 B2
(45) Date of Patent: May 25, 2004

(54) BALL GRID ARRAY CIRCUIT BOARD JUMPER

(75) Inventors: John T. Sprietsma, Portland, OR (US); Lilly Huang, Portland, OR (US); Henry W. Koertzen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/190,167

(22) Filed: Jul. 3, 2002

(65) Prior Publication Data
US 2004/0005790 A1 Jan. 8, 2004

(51) Int. Cl.⁷ .......................... H01R 12/00; H05K 1/00
(52) U.S. Cl. .......................................... 439/69; 439/74
(58) Field of Search .............................. 439/66, 74, 70, 439/69; 361/783, 767; 174/266

(56) References Cited

U.S. PATENT DOCUMENTS

| | | | |
|---|---|---|---|
| 5,587,887 A | 12/1996 | Price et al. | 361/794 |
| 5,591,941 A * | 1/1997 | Acocella et al. | 174/266 |
| 5,729,438 A | 3/1998 | Pieper et al. | 361/760 |
| 5,757,171 A * | 5/1998 | Babcock | 323/271 |
| 5,825,630 A * | 10/1998 | Taylor et al. | 361/790 |
| 6,104,088 A | 8/2000 | Hatano et al. | 257/698 |
| 6,285,558 B1 | 9/2001 | Frantz et al. | 361/760 |
| 6,333,563 B1 * | 12/2001 | Jackson et al. | 257/778 |
| 6,344,684 B1 * | 2/2002 | Hussain et al. | 257/697 |
| 6,399,417 B1 * | 6/2002 | Lee et al. | 438/106 |
| 6,416,332 B1 * | 7/2002 | Carron et al. | 439/70 |
| 6,430,057 B1 * | 8/2002 | Hoffmann et al. | 361/767 |
| 6,511,347 B2 * | 1/2003 | Chapman et al. | 439/571 |

* cited by examiner

Primary Examiner—Chandrika Prasad
(74) Attorney, Agent, or Firm—Schwegman, Lundberg, Woessner & Kluth, P.A.

(57) ABSTRACT

A circuit board assembly is provided, comprising a first circuit board and a ball-grid array jumper. The ball-grid array jumper comprises a second circuit board smaller in size than the first printed circuit board and has at least one layer of conductive traces and at least two solder ball connectors. The ball grid array jumper is mounted to the first printed circuit board via the solder ball connectors.

24 Claims, 3 Drawing Sheets

BALL GRID ARRAY CIRCUIT BOARD JUMPER

FIELD OF THE INVENTION

The invention relates generally to electronic printed circuit boards, and more specifically to high-density jumper connection via a ball grid array.

BACKGROUND OF THE INVENTION

Electronic components are typically assembled into complex circuits by mounting them on printed circuit boards. These printed circuit boards are usually flat nonconductive boards with one or more layers of a conductive material such as copper fixed on or in the printed circuit board. The layers of copper are etched or otherwise formed to specific shapes and patterns in the manufacturing process, such that the remaining conductive copper traces are routed to connect electrical components to be attached to the printed circuit board.

It is not uncommon for printed circuit boards such as these to have copper layers on both a top and bottom side of the circuit board, but also several layers of copper traces or patterns sandwiched at various depths within the circuit board itself. These traces allow greater flexibility in circuit routing, and usually allow designing a more compact circuit board for a particular circuit than would otherwise be possible. The various layers are sometimes dedicated to particular purposes, such as a ground layer that only serves to distribute ground or signal return connections to various components.

Multiple layers that serve to connect components to other components often must be connected to components attached to a different layer (top or bottom) or the layers must be attached to each other at selected points, requiring use of what are commonly known as vias. These vias typically are essentially small conductive plated-through hole elements oriented perpendicular to the top and bottom surfaces of a circuit board that extend through at least two conductive layers of the circuit board, and that electrically connect circuit traces on at least two of the conductive layers to each other.

But, each layer of a printed circuit board adds a significant amount of cost to the board, making use of as few layers as are practical to achieve the desired performance and configuration economically desirable. For example, it is estimated that for a printed circuit board of standard ATX personal computer motherboard size, the difference in board cost alone between a four-layer printed circuit board and a six-layer circuit board is approximately seven dollars. Unfortunately, the increasingly dense components used in modem electronic systems and the relatively complex power requirements of such systems can make designing a four-layer circuit board virtually impossible. As an example, a modem personal computer has hundreds of connections between the processor, chipset, memory, and attached bus, in addition to the required power distribution that may include 12 v, 5 v, 3.3 v, and other voltages at increasingly high current levels as transistor counts and clock speeds continue to increase.

The dilemma that is then faced by motherboard designers is how to create a densely routed motherboard that is cost-effective and has as few layers as is practical to achieve. What is desired is a way of enabling printed circuit board designers to design circuit boards with as few layers as is practical while enabling the high routing densities that sometimes require a greater number of circuit board layers.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

A need exists for a system that enables printed circuit board designers to design circuit boards with as few layers as is practical, yet enables the high routing densities that sometimes require a greater number of circuit board layers. This need is addressed by some embodiments of the present invention that provide a ball-grid array jumper. The ball-grid array jumper comprises a circuit board smaller in area than a main circuit board, and having at least one layer of conductive traces and a plurality of solder ball connectors. The ball grid array jumper is mounted to the main printed circuit board via at least two solder ball connectors, which further serve as electrical connections between the main circuit board and the conductive traces on the ball grid array jumper. Such a circuit board assembly effectively results in an increase in the number of usable circuit board layers in the location where the ball-grid array jumper is attached to the main circuit board, enabling routing of more conductive traces through a congested area at significantly lower cost than production of a main circuit board with additional layers.

Figure 1:
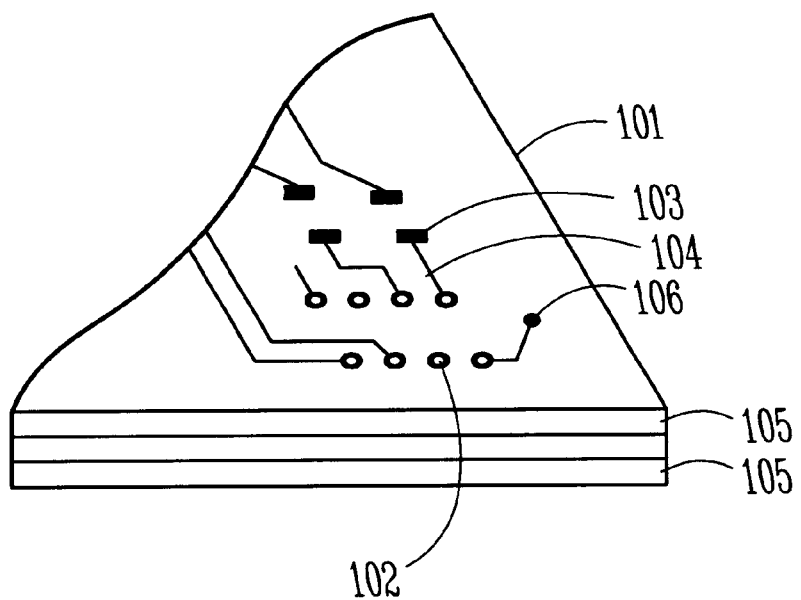
FIG. 1 shows a typical four-layer printed circuit board, consistent with the prior art.

FIG. 1 illustrates a typical printed circuit board, consistent with the prior art. The circuit board 101 is designed to receive electrical components such as may be mounted through holes as shown at 102 in the circuit board. Metal leads of the components are typically connected with solder to conductive pads with holes to receive the metal leads such as shown at 102, but are also often attached directly to pads without holes such as shown at 103 using surface-mount technology. The components are interconnected to form an electronic circuit with conductive traces as are shown at 104, which are typically made of copper. The body of the circuit board itself is therefore generally made of a good insulator, such as the fiberglass composite used in a standard FR4-type circuit board.

Modern circuit boards with complex circuits, high density components, and multiple power supply voltages distributed throughout the circuit board often comprise more than one layer of conductive traces. In the example circuit board of FIG. 1, a layer of conductive traces is located on the top of the circuit board (such as trace 104), on the bottom of the circuit board, and in two intermediate layers 105. The various layers of the circuit board may in turn be connected to each other by conductive elements known as vias, as shown at 106, that run perpendicular to the surface of the circuit board. Multiple layers and vias are used to route complex and dense circuits, such as where a greater number of conductive traces than will fit on a single conductive layer are needed and where circuit traces need to be routed across each other and so require multiple layers to completely route the circuit.

Modern computer systems not only have increasingly high density components such as motherboard chipset integrated circuits, memory, and processors which must be interconnected, but they often also require distribution of multiple voltage supply signals. For example, a typical modern split voltage microprocessor requires a split voltage regulator and conductive traces to supply both a 3.3 volt power supply signal to power external interface circuitry and a reduced voltage power supply signal to power internal processing circuitry. These power signals are derived from a split voltage regulator that is in turn powered by 12 volt and 5 volt supply signals. The reduced voltage power supply signal provided from the voltage regulator is often between one and three volts, and is determined by the design of the microprocessor. A computer motherboard with such a microprocessor on it also typically distributes a 5 volt and a 3.3 volt supply signal to power devices such as peripheral cards and other older components designed to operate these higher voltage levels. As a result, these increasingly complex circuit boards must not only route signals between the increasingly complex and dense circuit components, but must distribute a number of voltage supply signals to the components to provide them with power. This can be solved by adding additional layers to a printed circuit board, for example by using a six-layer circuit board in a personal computer instead of a four-layer circuit board. But, for a standard ATX-sized motherboard, addition of two more layers increases the cost of the board by approximately seven dollars per board in large volumes.

Figure 2:
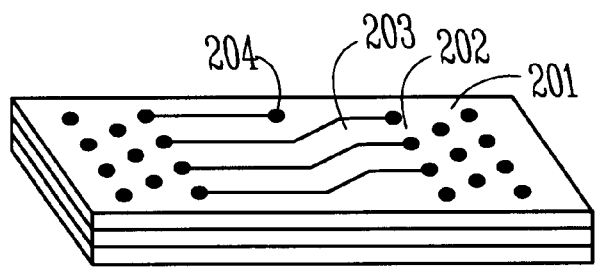
FIG. 2 shows a ball-grid array jumper, consistent with an embodiment of the present invention.

The present invention provides a more cost-efficient solution to this problem, utilizing a novel ball-grid array jumper as shown generally in FIG. 2. The example ball-grid array jumper 201 comprises a printed circuit board with four layers, and having at least two solder ball connectors 202. Each solder ball connector comprises a solder ball attached to a conductive element on the ball-grid array circuit board 201, and will serve to connect the ball-grid array jumper to a printed circuit board such as is shown in FIG. 1. The various solder ball connectors 202 are interconnected in an arrangement selected by the circuit designer to electrically connect selected solder ball connectors to other solder ball connectors, using electrical traces such as shown at 203. In embodiments of the invention where a multi-layer printed circuit board is used such as is illustrated here, layers of conductive material are again connected using vias as shown at 204.

Figure 3:
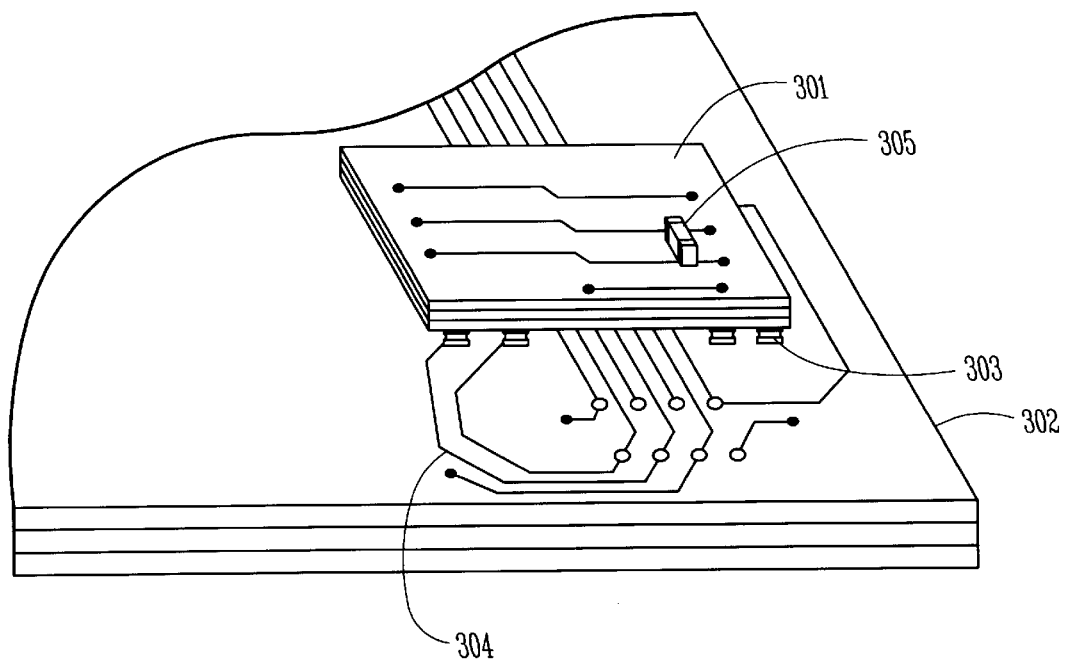
FIG. 3 shows a printed circuit board with a ball-grid array jumper attached, consistent with an embodiment of the present invention.

By attaching the ball-grid array jumper to a printed circuit board such as is illustrated generally in FIG. 3, the number of layers of conductive traces available to route a selected area of a printed circuit board is effectively increased. The ball-grid array jumper 301 is attached to the printed circuit board 302 via the solder ball connectors 303. The solder ball connectors both physically mount the ball-grid array jumper module to the circuit board and electrically connect the conductive traces 203 on the ball-grid array jumper 301 to the conductive traces 304 on the main printed circuit board. In one more specific embodiment of the present invention, the circuit board 302 has a split voltage regulator circuit that provides multiple supply voltages to a circuit board component needing multiple voltage supplies. The ball-grid array jumper 301 serves to distribute a supply voltage to circuit traces located in different parts of the circuit as laid out on the circuit board 302, enabling power distribution using only a four-layer circuit board instead of a six-layer board.

Because the ball-grid jumper in some embodiments such as are shown in FIGS. 2 and 3 takes the form of a printed circuit board having multiple layers, it is anticipated that in further embodiments of the invention various electrical components may be mounted to the ball-grid array jumper. For example, the bypass capacitor 305 shown in FIG. 3 is mounted to the opposite side of the four-layer circuit board as is mounted to the main circuit board, and serves to bypass or stabilize a voltage supply that is conducted across the ball-grid array jumper. By mounting this component on the ball-grid array jumper, it may be removed from the main board, freeing up space for other components and circuit traces while enabling denser and more efficient circuit layout on the main board.

The ball-grid array jumper in some embodiments of the invention is a printed circuit board smaller in area than a main printed circuit board to which it may be attached. The ball-grid array jumper therefore serves to increase routing density of conductive traces across a portion of the area of a main printed circuit board to which the ball-grid array jumper is attached. The area of the ball-grid array jumper in some embodiments of the invention will therefore be determined by determining the area of a main printed circuit board over which a greater routing density is desired.

Figure 4:
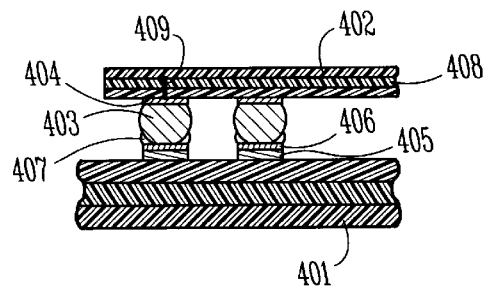
FIG. 4 shows a cross-section of a ball-grid array jumper attached to a circuit board, consistent with an embodiment of the present invention.

The connection between the circuit board and the ball-grid jumper is shown in greater detail in the cross-section diagram of FIG. 4. Circuit board 401 is attached to the ball-grid jumper 402 by two or more solder balls 403. The solder balls are initially connected to conductive pads 404 on the surface of the ball-grid jumper, and the solder is heated or reflowed to electrically and physically connect the solder balls to conductive pads 405 of the main circuit board 401. In some further embodiments of the invention, a printed solder layer 406 further melts during heating or reflowing, and facilitates connection between the ball-grid array and the circuit board. Still other embodiments of the invention utilize a paste or flux material 407 to further facilitate connection between the solder balls 403 and the printed circuit board conductive pads 405. In embodiments where a flux 407 is used, the flux encourages flow of solder on heating or reflowing, and results in more reliable connection between the solder ball 403 and conductive pad 405. In embodiments where material 407 is a conductive paste, the paste serves to ensure sound electrical connection between the solder bump 403 and conductive pad 405. Eutectic solder is a solder alloy having its components in such proportions that the melting point is the lowest possible with those components.

Within the ball-grid array jumper 402, conductive traces such as shown in layer 408, vias such as shown at 409, and other conventional circuit board elements serve to form conductive circuit elements and to interconnect other elements of an electric circuit. The ball-grid array jumper therefore functions much like a circuit board itself, providing additional circuit board routing and interconnect ability in the region in which the ball-grid array jumper is implemented.

Although the ball-grid array connection illustrated here utilizes solder bumps, it is anticipated that other ball-grid array technologies exist and will be developed, and are consistent with the present invention. For example the ball-grid array conductive pad 404 may be connected to a gold stud bump 403 that connects to electrical pad 405 of the circuit board with a conductive paste 407. This is but one example of other materials that may be used to produce a ball-grid array jumper consistent with the present invention.

Figure 5:
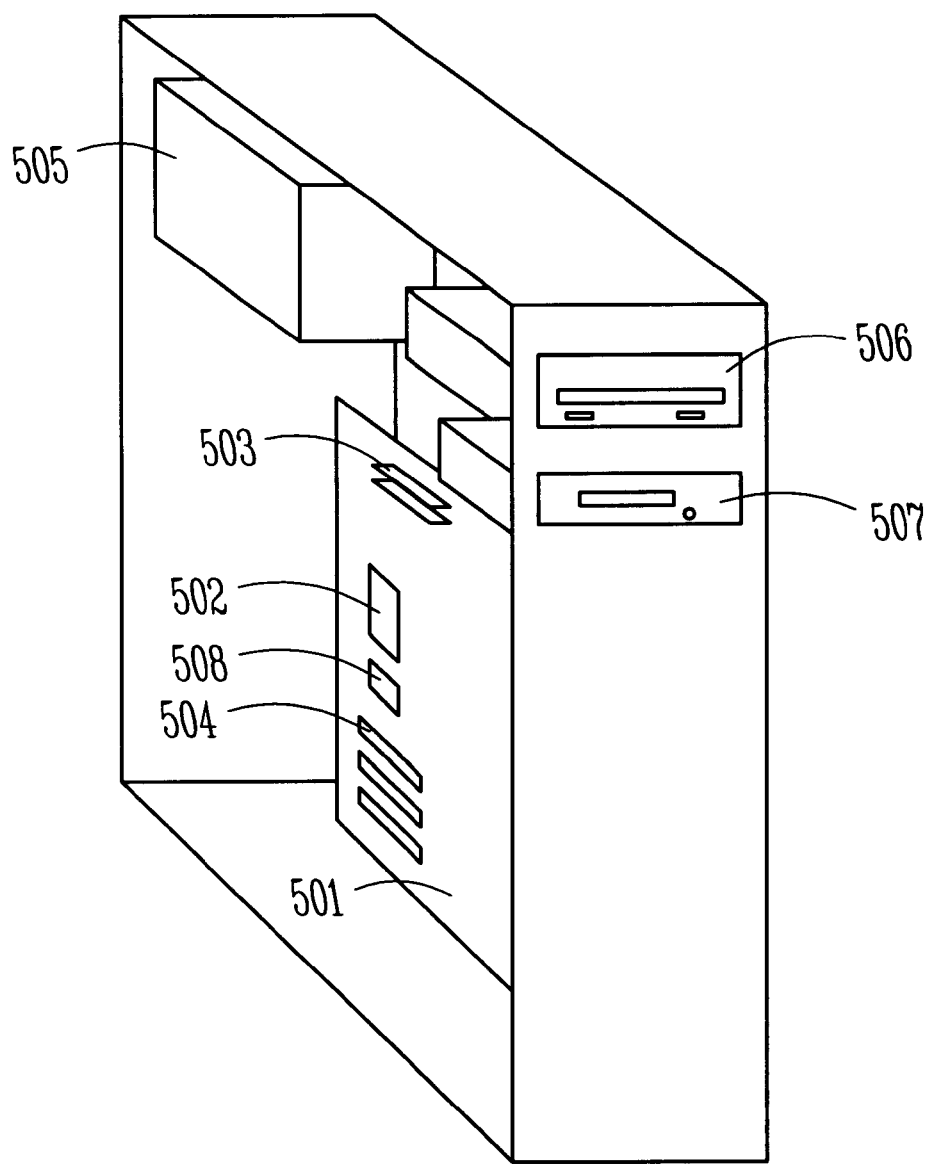
FIG. 5 shows a personal computer having a motherboard, consistent with an embodiment of the present invention.

FIG. 5 illustrates generally a computer, having a motherboard 501 and a processor 502. The computer further has memory 503, expansion slots 504, and a power supply 505. Storage is provided via storage devices such as CD-ROM drive 506, diskette drive 507, and one or more hard disk drives. Various embodiments of the personal computer of FIG. 5 are consistent with the present invention, such as the example embodiment shown here where ball-grid array jumper 508 provides connection between various parts of a circuit such as a split voltage regulator circuit.

Although specific embodiments of the invention have been illustrated and described herein, it will be appreciated by those of ordinary skill in the art that any method, apparatus, or other arrangement which is calculated to achieve the same purpose may be substituted for the specific embodiments shown. This application is intended to cover any adaptations or variations of the invention. The invention is therefore limited only by the appended claims, and the full scope of equivalents thereof.

What is claimed is:

1. A circuit board assembly, comprising:
    a first circuit board; and
    a ball-grid array jumper, the ball-grid array jumper comprising a second circuit board smaller in area than the first printed circuit board and having at least one layer of conductive traces and at least two solder ball connectors, at least one of the conductive traces electrically connecting at least two of the solder ball connectors, and the ball grid array jumper mounted to the first printed circuit board via the at least two solder ball connectors such that the at least one of the conductive traces connecting at least two of the solder ball connectors serves as a jumper to the first printed circuit board.

2. The circuit board assembly of claim 1, the second circuit board comprising an FR4 circuit board.

3. The circuit board assembly of claim 1, the second circuit board comprising a multi-layer circuit board.

4. The circuit board assembly of claim 3, the second circuit board comprising a four-layer circuit board.

5. The circuit board assembly of claim 3, wherein one or more electronic components are mounted to at least one layer of the second multi-layer circuit board.

6. The circuit board assembly of claim 1, the at least two solder ball connectors comprising eutectic solder.

7. The circuit board assembly of claim 1, wherein the first circuit board comprises a split voltage regulator, and the ball-grid array jumper serves to distribute at least one supply voltage across the first circuit board.

8. A ball-grid array jumper, comprising:
    a jumper circuit board smaller in size than a main circuit board and having at least one layer of conductive traces and at least two solder ball connectors, at least one of the conductive traces electrically connecting at least two of the solder ball connectors, and the ball grid array jumper mounted to the main circuit board via the at least two solder ball connectors such that the at least one of the conductive traces connecting at least two of the solder ball connectors serves as a jumper to the main printed circuit board.

9. The ball-grid array jumper of claim 8, the jumper circuit board comprising an FR4 circuit board.

10. The ball-grid array jumper of claim 8, the jumper circuit board comprising a multi-layer circuit board.

11. The ball-grid array jumper of claim 10, the multi-layer jumper circuit board comprising a four-layer circuit board.

12. The ball-grid array jumper of claim 10, the jumper circuit board further comprising one or more electronic components mounted to at least one layer of the multi-layer jumper circuit board.

13. The ball-grid array jumper of claim 8, the at least two solder ball connectors comprising eutectic solder.

14. The ball-grid array jumper of claim 8, wherein the main circuit board comprises a split voltage regulator, and the ball-grid array jumper serves to distribute at least one supply voltage across the main circuit board.

15. A method of making a printed circuit board assembly, comprising:
    mounting a ball-grid array jumper to a main circuit board, the ball-grid array jumper comprising a jumper circuit board smaller in size than the main printed circuit board and having at least one layer of conductive traces and at least two solder ball connectors, at least one of the conductive traces electrically connecting at least two of the solder ball connectors, the ball grid array jumper mounted to the first printed circuit board via the at least two solder ball connectors such that the at least one of the conductive traces connecting at least two of the solder ball connectors serves as a jumper to the first printed circuit board.

16. The method of claim 15, the jumper circuit board comprising an FR4 circuit board.

17. The method of claim 15, the jumper circuit board comprising a multi-layer circuit board.

18. The method of claim 17, the jumper circuit board comprising a four-layer circuit board.

19. The method of claim 17, the jumper circuit board further comprising one or more electronic components mounted to at least one layer of the multi-layer jumper circuit board.

20. The method of claim 15, the at least two solder ball connectors comprising eutectic solder.

21. The method of claim 15, wherein the main circuit board comprises a split voltage regulator, and the ball-grid array jumper serves to distribute at least one supply voltage across the main circuit board.

22. A computerized system, comprising:
    a motherboard;
    a processor attached to the motherboard; and
    at least one ball-grid array jumper, the at least one ball-grid array jumper comprising a circuit board smaller in area than the motherboard and having at least one layer of conductive traces and at least two solder ball connectors, at least one of the conductive traces electrically connecting at least two of the solder ball connectors, and the at least one ball grid array jumper mounted to the motherboard via the at least two solder ball connectors such that the at least one of the conductive traces connecting at least two of the solder ball connectors serves as a jumper to the first printed circuit board.

23. The computerized system of claim 22, wherein the ball grid array jumper provides connection between elements of a split voltage regulator circuit.

24. The computerized system of claim 22, the ball grid array jumper further comprising one or more electronic components mounted to at least one layer of the ball grid array jumper circuit board.

* * * * *